(12) United States Patent
Yamane

(10) Patent No.: US 11,573,392 B2
(45) Date of Patent: Feb. 7, 2023

(54) IMAGING DEVICE, IMAGE GENERATING DEVICE, AND IMAGING METHOD

(71) Applicant: Kioxia Corporation, Tokyo (JP)

(72) Inventor: Takeshi Yamane, Tsukuba Ibaraki (JP)

(73) Assignee: Kioxia Corporation, Tokyo (JP)

( * ) Notice: Subject to any disclaimer, the term of this patent is extended or adjusted under 35 U.S.C. 154(b) by 330 days.

(21) Appl. No.: 17/016,730

(22) Filed: Sep. 10, 2020

(65) Prior Publication Data

US 2021/0231905 A1 Jul. 29, 2021

(30) Foreign Application Priority Data

Jan. 24, 2020 (JP) .............................. JP2020-010215

(51) Int. Cl.
| | |
|---|---|
| *H01L 31/115* | (2006.01) |
| *G02B 7/04* | (2021.01) |
| *H01L 31/14* | (2006.01) |
| *G02B 7/182* | (2021.01) |
| *G02B 5/08* | (2006.01) |

(52) U.S. Cl.
CPC ................ *G02B 7/04* (2013.01); *G02B 5/08* (2013.01); *G02B 7/182* (2013.01); *H01L 31/115* (2013.01); *H01L 31/14* (2013.01)

(58) Field of Classification Search
CPC .............. G02B 5/08; G02B 7/00; G02B 7/02; G02B 7/04; G02B 7/182; G02B 21/00; G02B 21/0004; H01L 31/14; H01L 31/115
USPC .................................................. 359/824, 368
See application file for complete search history.

(56) References Cited

U.S. PATENT DOCUMENTS

| | | | | |
|---|---|---|---|---|
| 8,891,164 | B2 * | 11/2014 | Kuebler ................. | G02B 21/00 359/389 |
| 11,189,392 | B2 * | 11/2021 | Matsuyama ........... | G21K 1/067 |
| 2004/0223214 | A1 * | 11/2004 | Atkinson ............. | G02B 21/002 359/368 |
| 2012/0147460 | A1 * | 6/2012 | Kubler ................... | G02B 21/22 359/389 |
| 2017/0052128 | A1 * | 2/2017 | Yun ...................... | G01N 23/223 |
| 2017/0082597 | A1 * | 3/2017 | Matsumoto ........... | G01N 21/41 |
| 2017/0089837 | A1 * | 3/2017 | Matsumoto ........... | G01B 9/021 |
| 2018/0261352 | A1 | 9/2018 | Matsuyama et al. | |

(Continued)

FOREIGN PATENT DOCUMENTS

| | | | |
|---|---|---|---|
| JP | 6043906 | B2 | 12/2016 |
| JP | 6048867 | B2 | 12/2016 |

(Continued)

*Primary Examiner* — William R Alexander
(74) *Attorney, Agent, or Firm* — Finnegan, Henderson, Farabow, Garrett & Dunner, LLP

(57) ABSTRACT

An imaging device of an embodiment comprises an aperture that transmits imaging light applied to a sample, a detector including a linear sensor comprising a linear light receiving surface extending in a first direction, a first image forming element that collects components of the imaging light in the first direction and forms an image on the light receiving surface with a first wave front aberration amount, and a second image forming element that collects components of the imaging light in a second direction orthogonal to the first direction and forms an image on the light receiving surface with a second wave front aberration amount smaller than the first wave front aberration amount.

15 Claims, 8 Drawing Sheets

(56) References Cited

U.S. PATENT DOCUMENTS

2019/0033284 A1* 1/2019 Matsumoto ............ G01B 11/24
2020/0033488 A1 1/2020 Yamane

FOREIGN PATENT DOCUMENTS

JP 6478433 B2 3/2019
JP 2020-16543 A 1/2020

* cited by examiner

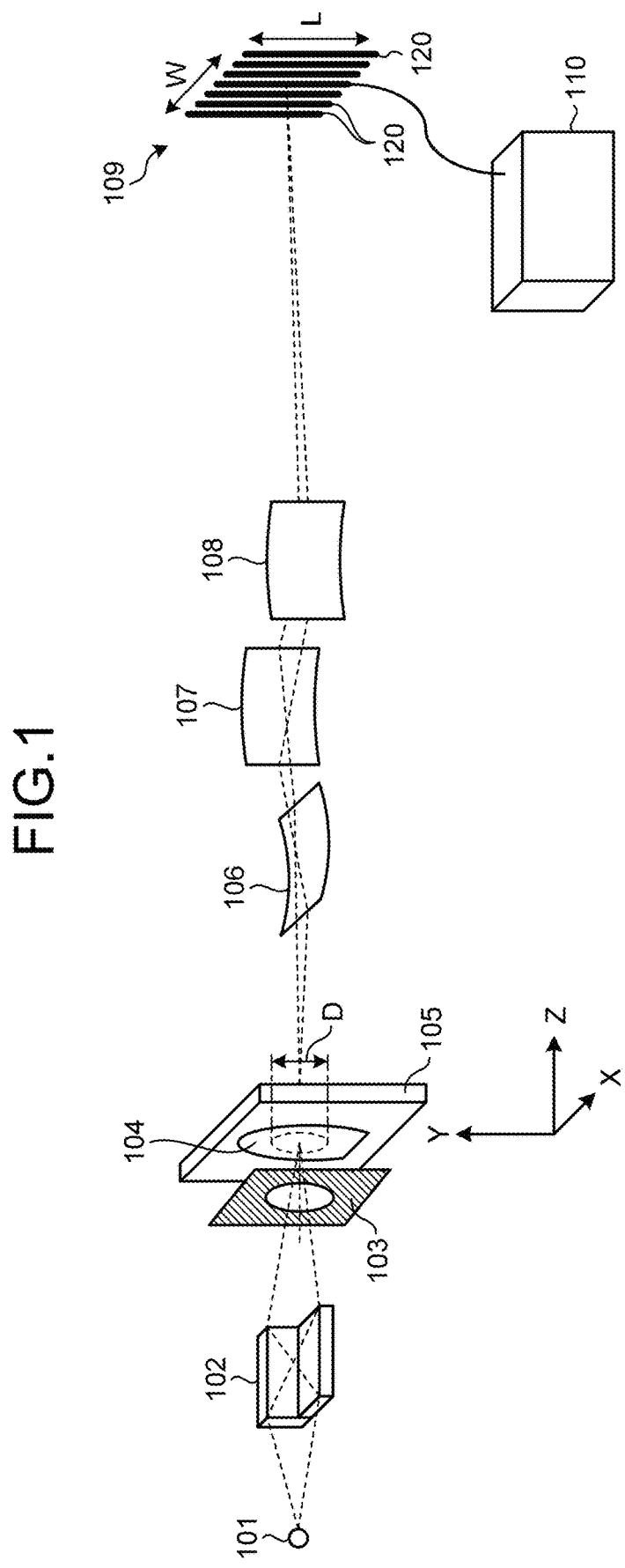

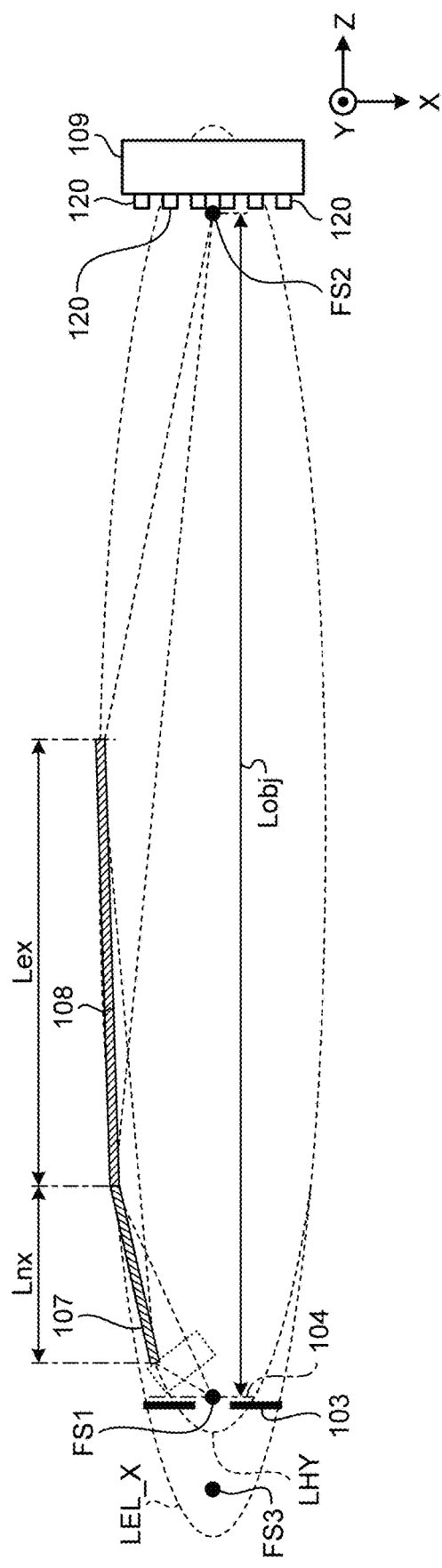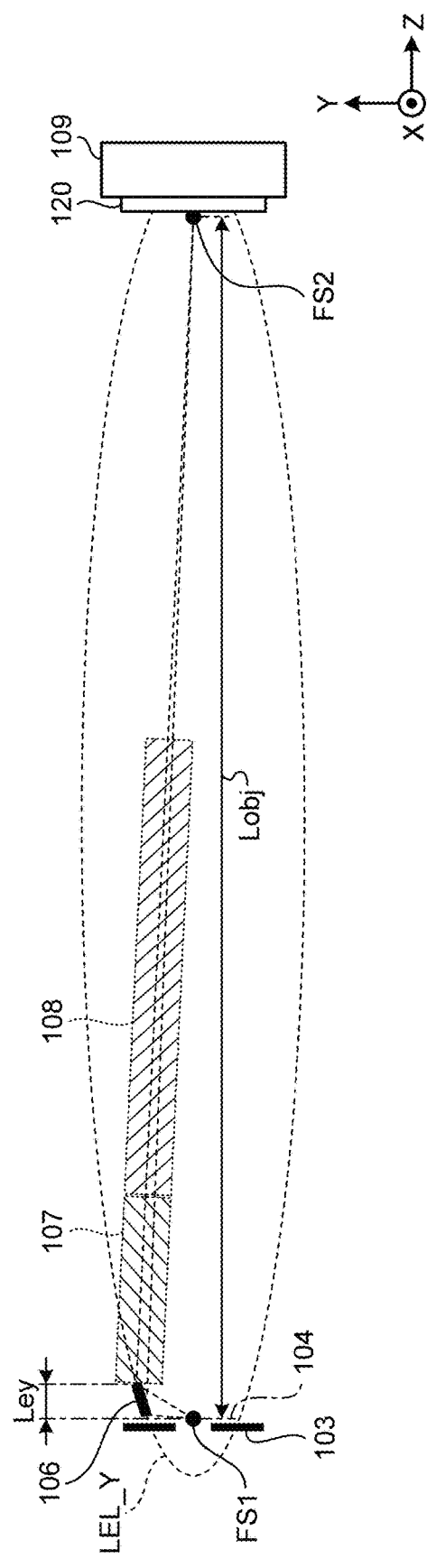

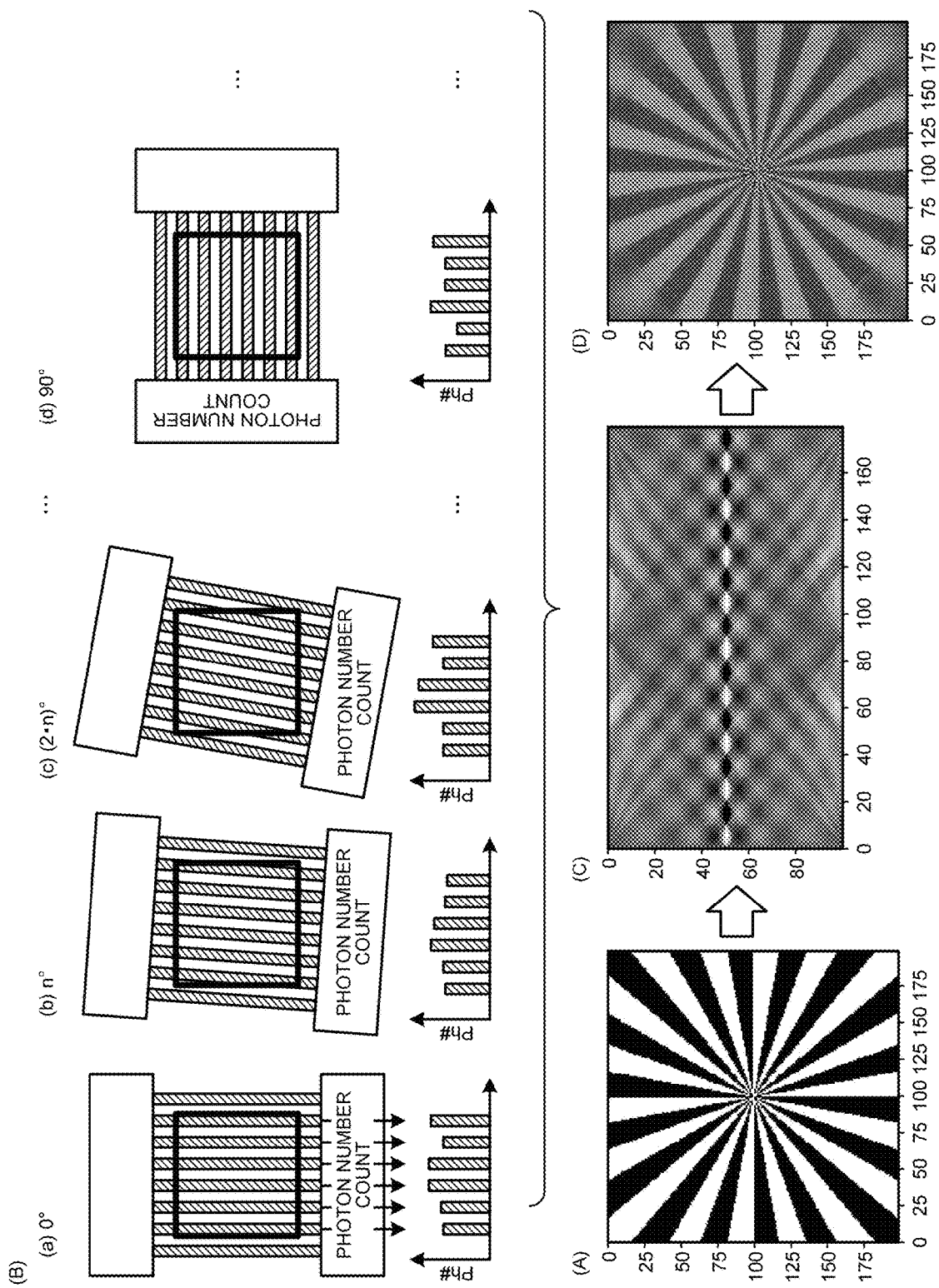

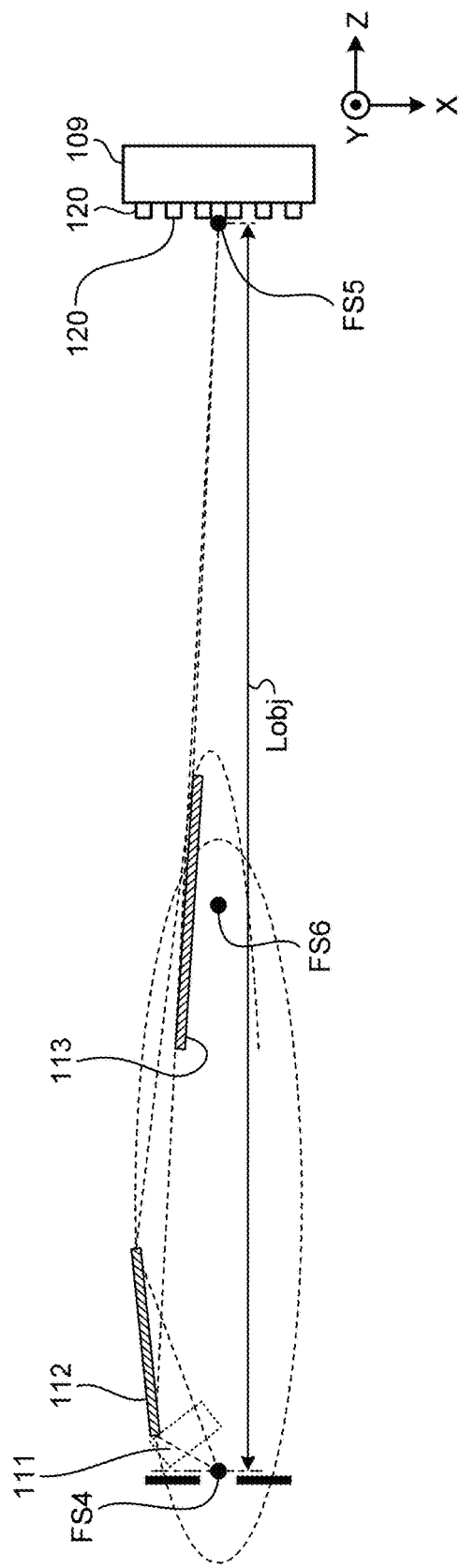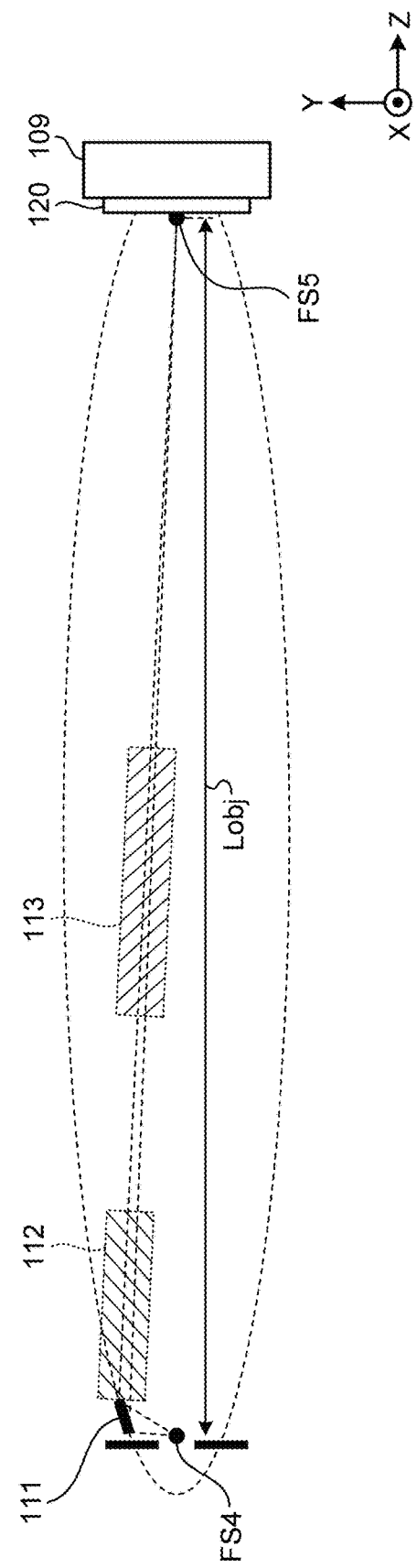

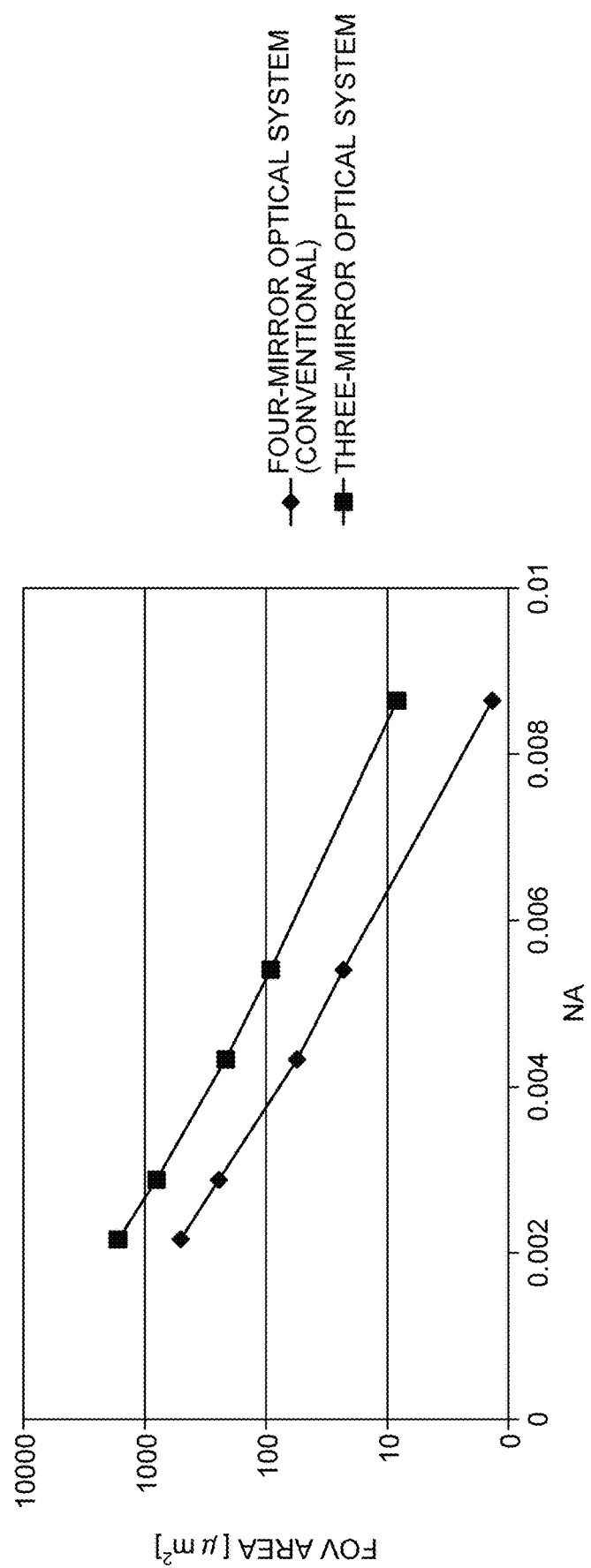

IMAGING DEVICE, IMAGE GENERATING DEVICE, AND IMAGING METHOD

CROSS-REFERENCE TO RELATED APPLICATIONS

This application is based upon and claims the benefit of priority from Japanese Application No. 2020-010215, filed on Jan. 24, 2020, the entire contents of which are incorporated herein by reference.

FIELD

Embodiments described herein generally relate to an imaging device, an image generating device, and an imaging method.

BACKGROUND

As a method of realizing an optical system of a microscope using X-rays transmitted through a wafer, a method of reducing aberration by using an elliptical mirror and a hyperbolic mirror in each of X direction and Y direction is known (for example, refer to Japanese Patent No. 6478433).

The above-described method requires four mirrors, so that there is a problem that an energy loss caused by a reflectance (<100%) of the mirror is large.

Furthermore, in a case where a length of an entire optical system is limited, there is a problem that a space for arranging the mirrors is small and it is difficult to increase a length of the mirror to enlarge a numerical aperture and a field of view.

Therefore, a problem to be solved by the embodiment is to provide an imaging device, an image generating device, and an imaging method capable of reducing the energy loss to obtain an image with high contrast, and of enlarging the numerical aperture and the field of view.

BRIEF DESCRIPTION OF DRAWINGS

FIG. 1 is a schematic diagram of a configuration of an imaging device according to a first embodiment;

FIGS. 2A and 2B are illustrative views of arrangement of image forming elements in the imaging device of the first embodiment;

FIG. 5 is an illustrative view of image reconfiguration;

FIGS. 6A and 6B are illustrative views of a variation of the first embodiment;

FIG. 7 is an illustrative view of another effect of the first embodiment;

DETAILED DESCRIPTION

Figure 3:
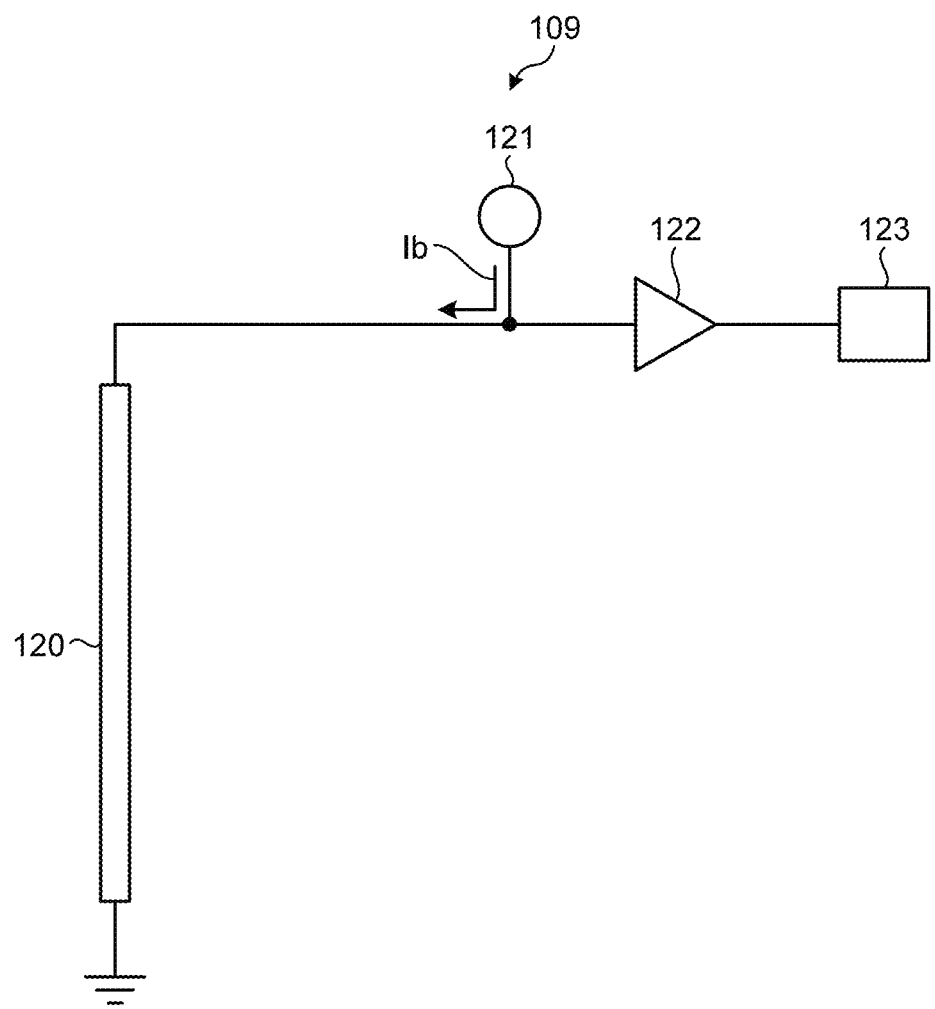
FIG. 3 is a principle circuit configuration diagram of a one-dimensional detector.

Hereinafter, an embodiment is described with reference to the drawings. The drawings are schematic or conceptual, and the dimensions, proportions and the like of the drawings are not always the same as actual ones. In the drawings, the same reference signs are assigned to the same or corresponding portions, and the description is repeated as necessary. For simplification, there also is a case where no reference sign is assigned even if there are the same or corresponding portions.

In general, An imaging device of an embodiment comprises an aperture that limits an irradiation region of imaging light applied to a sample into a circular shape, a detector comprising a linear sensor including a linear light receiving surface extending in a first direction, a first image forming element that collects components of the imaging light in the first direction and forms an image on the light receiving surface with a first wave front aberration amount, and a second image forming element that collects components of the imaging light in a second direction orthogonal to the first direction and forms an image on the light receiving surface with a second wave front aberration amount smaller than the first wave front aberration amount.

(1) First Embodiment

FIG. 1 is a schematic diagram of a configuration of an imaging device according to a first embodiment.

As illustrated in FIG. 1, an imaging device 100 includes a light source 101, an illumination mirror 102, an aperture 103, a stage 105 on which a sample 104 is placed, a first elliptical mirror 106, a hyperbolic mirror 107, a second elliptical mirror 108, a one-dimensional detector 109, and a personal computer 110.

In the above-described configuration, the first elliptical mirror 106 serves as a first image forming element, and the hyperbolic mirror 107 and the second elliptical mirror 108 serve as a second image forming element.

The aperture 103, the stage 105 on which the sample 104 is placed, the first elliptical mirror 106, the hyperbolic mirror 107, the second elliptical mirror 108, and the one-dimensional detector 109 serve as an imaging device.

The personal computer 110 serves as an image reconfiguration unit.

Furthermore, the light source 101, the illumination mirror 102, the imaging device, and the image reconfiguration unit serve as an image generating device.

As the light source 101 of the imaging device 100 of the first embodiment, an X-ray source which irradiates a target made of molybdenum and the like with electron beams to generate X-rays is used.

The illumination mirror 102 collects the X-rays emitted from the light source 101. As a result, the X-rays pass through the aperture 103 to be applied to the sample 104.

As the illumination mirror, any mirror such as a Montel mirror which may collect the X-rays emitted from the light source 101 to apply to the sample 104 may be used.

The aperture 103 forms a region in which the sample 104 is irradiated with the X-rays into a circular shape, and the center of this region coincides with an optical axis (a transmission position of a principal ray).

In this embodiment, the sample 104 is a silicon wafer on which a plurality of semiconductor devices is formed, and the sample 104 is placed on the stage 105 having a mechanism capable of moving in XYZ directions and rotating about the optical axis.

FIGS. 2A and 2B are illustrative views of arrangement of the image forming elements in the imaging device of the first embodiment.

The first elliptical mirror 106 which serves as the first image forming element includes an elliptical reflecting concave surface, and guides the X-rays transmitted through the sample 104 to a reflecting surface of the hyperbolic mirror

107. The first elliptical mirror 106 collects components in the Y direction of the X-rays transmitted through the sample 104 and forms an image thereof on a detection surface (image surface) of the one-dimensional detector 109.

In this case, the reflecting concave surface of the first elliptical mirror 106 has a shape along an ellipse LEL_Y with one focal point FS1 and the other focal point FS2 as illustrated in FIG. 2B.

Furthermore, the focal point FS1 is on a surface of the sample 104, and the focal point FS2 is on the detection surface of the one-dimensional detector 109.

The hyperbolic mirror 107 which serves as the second image forming element includes a hyperbolic reflecting concave surface. Then, the hyperbolic mirror 107 cooperates with the second elliptical mirror to be described later to collect components in the X direction of the X-rays reflected by the first elliptical mirror 106 to be guided thereto and forms an image thereof on the detection surface (image surface) of the one-dimensional detector 109.

In this case, the reflecting concave surface of the hyperbolic mirror 107 has a shape along a hyperbolic curve LHY in which one focal point is the focal point FS1 and the other focal point is in the same position (or substantially the same position which may be regarded as the same) as a focal point FS3 which is one focal point of an ellipse LEL_X as illustrated in FIG. 2A.

Furthermore, the second elliptical mirror 108 which serves as the second image forming element includes an elliptical reflecting concave surface. The second elliptical mirror 108 collects components in the X direction of the X-rays reflected by the hyperbolic mirror 107 to be guided thereto and forms an image thereof on the detection surface (image surface) of the one-dimensional detector 109.

Furthermore, the reflecting concave surface of the second elliptical mirror 108 has the focal point FS3 of the hyperbolic curve LHY as one focal point and the focal point FS2 the same (or substantially the same which may be regarded as the same) as that of the ellipse LEL_Y as the other focal point as illustrated in FIG. 2A. Furthermore, the reflecting concave surface of the second elliptical mirror 108 has a shape along the ellipse LEL_X orthogonal to the ellipse LEL_Y.

In the above-described configuration, the hyperbolic mirror 107 and the second elliptical mirror 108 which serve as the second image forming element cooperate to serve to reduce wave front aberration in the X direction of the X-rays. Specifically, shapes of the ellipse LEL_X and the hyperbolic curve LHY are determined such that a value of RMS(Root Means Square) wave front aberration in the X direction is $0.08 \times \lambda$ ($\lambda$ is wavelength) or smaller.

In this first embodiment, the one-dimensional detector 109 is a detector in which linear pixels in the Y direction are arrayed at regular intervals in the X direction. Examples of the detector which forms the one-dimensional detector 109 may include a superconducting strip detector in which a plurality of superconducting strips (superconducting single photon detectors) is arranged, for example.

Specifically, the one-dimensional detector 109 includes a plurality of superconducting strips (superconducting single photon detectors) 120 arranged so as to be parallel to each other in the Y direction at regular intervals.

In this case, a width and a thickness of the superconducting strip 120 are 200 nm or smaller. This is for reducing a cross-sectional area of the superconducting strip 120 to such an extent that a superconducting region is divided.

A material of the superconducting strip 120 may be appropriately selected from well-known materials. However, the higher an X-ray absorption rate such as a material containing tantalum, the higher a detection efficiency of X-ray photons. In the first embodiment, the number of superconducting strips 120 is seven, but the number thereof may be one to six or eight or larger.

FIG. 3 is a principle circuit configuration diagram of the one-dimensional detector.

As illustrated in FIG. 3, the one-dimensional detector 109 includes a current source 121 connected to one end of the superconducting strip 120 the other end of which is grounded to supply a bias current Ib to the superconducting strip 120, an amplifier 122 which amplifies an electric signal generated in the superconducting strip 120, and a measuring instrument 123 which counts a pulsed electric signal detected when the X-ray photons are detected on the basis of an output signal of the amplifier 122.

Meanwhile, the current source 121, the amplifier 122, and the measuring instrument 123 may also be provided outside the one-dimensional detector 109. For example, it is also possible to provide the current source 121, the amplifier 122, and the measuring instrument 123 in the personal computer 110.

Here, a principle of detecting the X-ray photons in the superconducting strip 120 is described.

Figure 4:
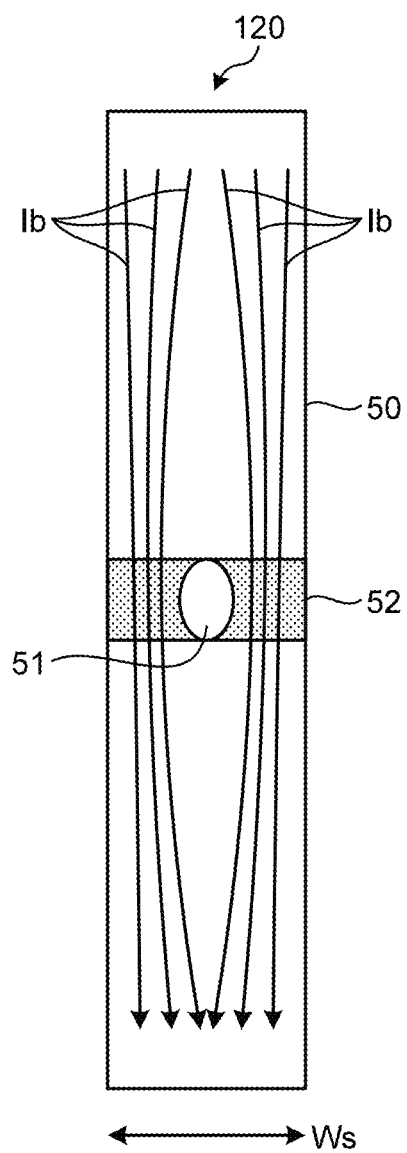
FIG. 4 is an illustrative view of a principle of detecting X-ray photons in a superconducting strip.

FIG. 4 is an illustrative view of the principle of detecting the X-ray photons in the superconducting strip.

In a state in which the superconducting strip 120 is cooled to reach temperature equal to or lower than critical temperature by a refrigerator not illustrated to be put into a superconducting state, the X-ray photons are allowed to be incident on the superconducting strip 120 in a state in which the bias current Ib slightly lower than a critical current to maintain the superconducting state of the superconducting strip 120 is supplied from the current source 121.

At that time, since the width (a length in a Ws direction in FIG. 4) and thickness of the superconducting strip 120 are 200 nm or smaller, the cross-sectional area of superconducting strip 120 is small. Therefore, when the X-ray photons are absorbed in the superconducting strip 120, as illustrated in FIG. 4, a hot spot region 51 being a region transiting to a normal conducting state referred to as a hot spot is generated in the superconducting region 50 of the superconducting strip 120. Since electric resistance of the hot spot region 51 increases, as illustrated in FIG. 4, the bias current Ib bypasses the hot spot region 51 and flows in a bypass region 52 which is another region.

When a current equal to or larger than the critical current flows in the bypass region 52, the bypass region 52 transits to the normal conducting state and the electric resistance increases. As a result, the superconducting region 50 is finally divided. That is, a state in which the superconducting region of the superconducting strip 120 described above is divided (divided state) occurs.

Thereafter, the hot spot region 51 and the bypass region 52 which transit to the normal conducting state disappear rapidly by cooling, so that a pulsed electric signal is generated by temporal electric resistance generated by the division of the superconducting region 50. The number of X-ray photons may be detected by amplifying this pulsed electric signal by the amplifier 122 and counting the pulsed electric signal with the measuring instrument 123.

Although the above description relates to one projection position, the stage 105 is rotated in units of n degrees, and the number of X-ray photons is detected at intervals of n degrees in a range from 0 to 180 degrees to form a sinogram, thereby performing image reconfiguration.

In this case, an angle n is determined so as to be able to evenly divide the range from 0 to 180 degrees such that intensity data may be obtained as evenly as possible.

FIG. 5 is an illustrative view of the image reconfiguration.

In FIG. 5, for easier understanding, it is illustrated in a state in which the one-dimensional detector 109 is rotated. However, actually, in the device in FIG. 1, the stage 105, and eventually the sample 104 are rotated to effectively obtain a similar state.

Here, the sinogram represents output data of the superconducting strip 120 in each detection position (projection position). That is, the sinogram represents the output data of each superconducting strip 120 as luminance display in time series. Since this is a data sequence before the image reconfiguration as a CT image, a reconfigured image is obtained on the basis of the sinogram.

For example, assume that the sample 104 is as illustrated in FIG. 5A.

With the stage 105 in a position at 0 degree, the X-rays are incident thereon from the light source 101 to be applied to the sample 104 on the stage 105 through the aperture 103.

Then, the X-rays transmitted through the sample 104 are incident on the first elliptical mirror 106 where the components in the Y direction of the X-rays are collected, and guided to the hyperbolic mirror 107 such that the image is formed on the detection surface (image surface) of the one-dimensional detector 109. At that time, a position in which an image of one point on the sample 104 is formed on the image surface has a spread (image spread) within a certain position range in the Y direction due to wave front aberration in the Y direction. However, since the superconducting strip is linear in the Y direction and it is detected by the same superconducting strip in any position in the Y direction, it is sufficient that a length L in the Y direction of the superconducting strip is larger than a length obtained by adding an image spread amount to a width in the Y direction corresponding to the region in which the sample 104 is irradiated with the X rays. Therefore, RMS wave front aberration in the Y direction may be larger than the RMS wave front aberration in the X direction.

Subsequently, the X-rays incident on the hyperbolic mirror 107 are reflected to be incident on the second elliptical mirror 108, and an image thereof is formed on the detection surface (image surface) of the one-dimensional detector 109.

At that time, a position in which an image of one point on the sample 104 is formed on the image surface has an image spread within a certain position range in the X direction due to the wave front aberration in the X direction. If it is detected by another adjacent superconducting strip 120 due to this image spread, this leads to so-called image blur. Therefore, it is necessary to keep the RMS wave front aberration in the X direction to an allowable value or lower.

In this state, the pulsed electric signal generated by the division of the superconducting region 50 is amplified by the amplifier 122 and counted by the measuring instrument 123, thereby counting the number of X-ray photons (#pH) for each superconducting strip 120, then an image intensity profile at 0 degree as illustrated in FIG. 5B(a) is obtained.

Similarly, as illustrated in FIGS. 5B(b) to 5B(d), in a case where the angle n is an angle which is a divisor of 90, image intensity profiles at n degrees, 2·n degrees, . . . , and 90 degrees are obtained. Furthermore, as necessary, image intensity profiles at (90+n) degrees to (180−n) degrees are obtained.

Then, the obtained image intensity profiles are combined to obtain a sinogram corresponding to an entire imaging surface of the sample 104 as illustrated in FIG. 5C.

Then, an image is reconfigured from the sinogram corresponding to the entire imaging surface of the sample 104 in FIG. 5C by using a projection-slice theorem, and an image in a region 111 of the sample 104 is reconfigured to be obtained as illustrated in FIG. 5D.

(1.1) First Variation of First Embodiment

FIGS. 6A and 6B are illustrative views of a variation of the first embodiment.

In the above description of the first embodiment, the first elliptical mirror 106, the hyperbolic mirror 107, and the second elliptical mirror 108 are used as the image forming elements. However, it is also possible to configure to use a first elliptical mirror 111 which collects light in a Y direction, a second elliptical mirror 112 which collects light in an X direction, and a hyperbolic mirror 113 which collects light in the X direction in place of them.

In the above-described configuration, the first elliptical mirror 111 serves as a first image forming element, and the second elliptical mirror 112 and the hyperbolic mirror 113 serve as a second image forming element.

In this case, as illustrated in FIGS. 6A and 6B, ellipses defining a reflecting concave surface of the first elliptical mirror 111 and a reflecting concave surface of the second elliptical mirror 112 have the same (or substantially the same which may be regarded as the same) one focal point on FS4 on a sample 104 and orthogonal to each other.

Furthermore, the other focal point of the ellipse defining the reflecting concave surface of the first elliptical mirror 111 and one focal point of a hyperbolic curve defining a reflecting convex surface of the hyperbolic mirror 113 are the same (or substantially the same which may be regarded as the same) and on FS5 on a detection surface of a one-dimensional detector 109, and the other focal point FS6 of the ellipse defining the reflecting concave surface of the second elliptical mirror 112 is the same (or substantially the same which may be regarded as the same) as the other focal point of the hyperbolic curve defining the reflecting convex surface of the hyperbolic mirror 113.

(1.2) Second Variation of First Embodiment

In the above description, although the case where the stage 105 is rotated for detection is described, it is also possible to integrally rotate the first elliptical mirror 106, the hyperbolic mirror 107, the second elliptical mirror 108 and the one-dimensional detector 109 in the first embodiment, and to integrally rotate the first elliptical mirror 111, the second elliptical mirror 112, the hyperbolic mirror 113, and the one-dimensional detector 109 in the first variation of the first embodiment.

(1.3) Effect of First Embodiment

As described above, according to the first embodiment, it is not necessary to significantly reduce a wave front aberration amount of an image forming element which collects components in a Y direction and forms an image thereof, so that it is possible to use one first elliptical mirror 106 only as the image forming element. Therefore, it is possible to suppress a light intensity loss as compared with a case where a combination of an elliptical mirror and a hyperbolic mirror is used as the image forming element which collects the components in the Y direction and forms an image thereof.

FIG. 7 is an illustrative view of another effect of the first embodiment.

As illustrated in FIG. 7, as compared with a conventional four-mirror optical system using four image forming mirrors, according to a three-mirror optical system using three image forming mirrors according to the first embodiment, a space in which the image forming mirrors as the image forming elements are arranged becomes effectively larger, so that it becomes possible to arrange larger mirrors and eventually enlarge a numerical aperture (NA) and a field of vision (FOV).

(2) Second Embodiment

Figure 8:
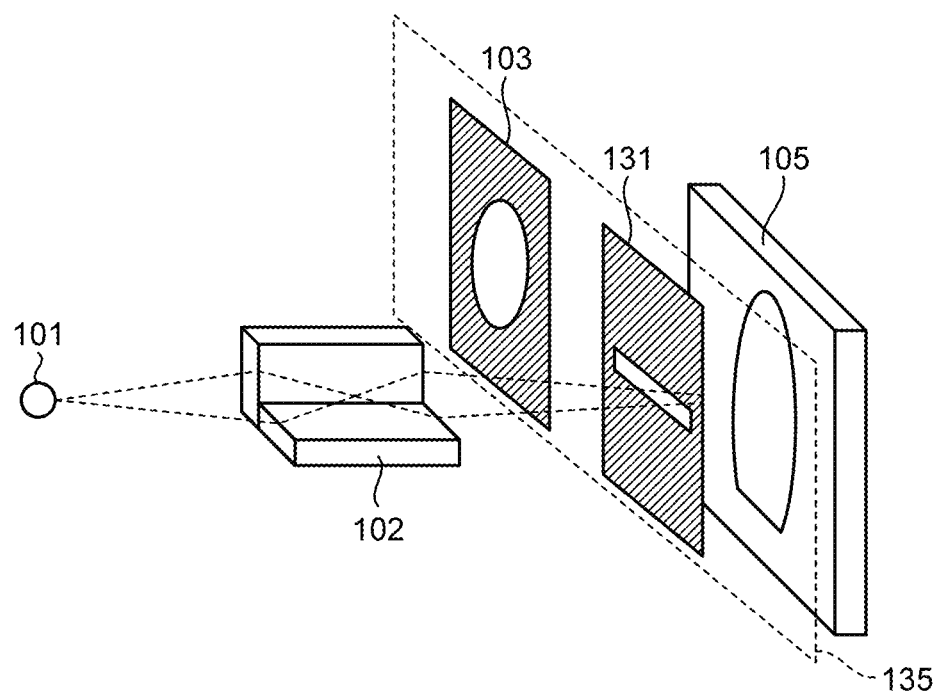
FIG. 8 is a schematic diagram of a configuration of an imaging device according to a second embodiment.
Figure 9:
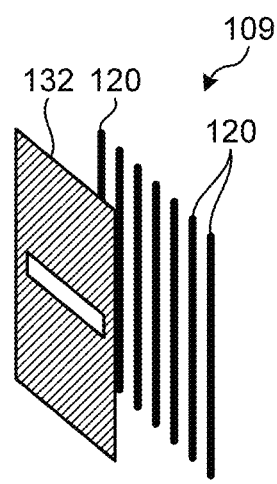
FIG. 9 is a schematic diagram of a configuration of an imaging device according to a variation of the second embodiment.

Next, a second embodiment is described in detail. FIG. 8 is a configuration diagram of a substantial part of the second embodiment.

In FIG. 8, the same reference sign is assigned to a portion similar to that in FIG. 1.

The second embodiment is different from the first embodiment in following points.

In the first embodiment, only the aperture 103 which forms the circular irradiation region is used as the aperture for the sample 104. However, the second embodiment is different from that in using an aperture 131 which forms a rectangular irradiation region on the sample 104 in addition to the aperture 103 and in providing a switching mechanism 135 which switches between the aperture 131 and the aperture 103 which forms a circular irradiation region. Other configurations are similar to those of the first embodiment.

In the above-described configuration, it is assumed that the center of gravity of the rectangle of the aperture 131 and the center of the circle of the aperture 103 (a transmission position of a principal ray) coincide with each other.

First, a stage 105 is arbitrarily moved in an X direction or a Y direction, and an image in an X-ray irradiation region of the sample 104 (a region of diameter D on the sample 104 in FIG. 1) is obtained using the aperture 103.

Next, while checking the obtained image, a desired position of the sample 104 is moved to the center of the circle of the aperture 103 (the transmission position of the principal ray).

Next, the switching mechanism 135 switches the aperture 103 to the aperture 131 to perform imaging, and it is output from a one-dimensional detector 109, thereby obtaining an image intensity profile in the desired position.

According to the second embodiment, the image intensity profile in the desired position of the sample 104 may be obtained without rotating the stage 105.

Therefore, it becomes possible to suppress a disturbance factor such as vibration of the stage caused by the rotation.

(2.1) Variation of Second Embodiment

FIG. 8 is a configuration diagram of a substantial part of a variation of the second embodiment.

In the above description, the aperture 131 which forms the rectangular irradiation region is used in place of the aperture 103, but it is also possible to configure to provide an aperture 132 which forms a rectangular detection region and a switching mechanism not illustrated capable of inserting and removing the aperture 132 immediately before a one-dimensional detector 109 in place of the aperture 131 and the switching mechanism.

In this variation also, as in the second embodiment, a stage 105 is arbitrarily moved in an X direction or a Y direction and an image in an X-ray irradiation region of a sample 104 (a region of diameter D on the sample 104 in FIG. 1) is obtained by using the aperture 103, then a desired position of the sample 104 is moved to a position corresponding to the center of the circle of the aperture 103 (a transmission position of a principal ray) while checking the obtained image, the aperture 132 is inserted on an optical path by the switching mechanism to perform imaging, and it is output from the one-dimensional detector 109, so that an image intensity profile in the desired position is obtained.

As a result, as in the second embodiment, it becomes possible to suppress a disturbance factor such as vibration of a stage caused by rotation.

(3) Variation of Embodiments

In the above description, the linear superconducting strip 120 is used, but in place of this, it is also possible to configure to use an array-shaped two-dimensional detector including a plurality of pixels (light receiving surfaces) to add outputs of the plurality of pixels (light receiving surfaces) arranged linearly in an X direction and handle as the output of the linear superconducting strip 120.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imaging device comprising:
   an aperture that transmits imaging light applied to a sample;
   a detector comprising a linear sensor including a linear light receiving surface extending in a first direction;
   a first image forming element that collects components of the imaging light in the first direction and forms an image on the light receiving surface with a first wave front aberration amount; and
   a second image forming element that collects components of the imaging light in a second direction orthogonal to the first direction and forms an image on the light receiving surface with a second wave front aberration amount smaller than the first wave front aberration amount.

2. The imaging device according to claim 1, wherein the aperture having a circular shape opening.

3. The imaging device according to claim 1, wherein a length of the linear sensor in the first direction is longer than a length obtained by adding an image spread amount generated by the first wave front aberration amount to a value corresponding to a width in the first direction of an irradiation region of the imaging light applied to the sample.

4. The imaging device according to claim 1, wherein the first image forming element comprises a first elliptical mirror wherein a reflecting surface shape of which is formed along a first ellipse, and
   the second image forming element comprises:
   a hyperbolic mirror formed along a hyperbolic curve with one focal point substantially the same as one focal point of the first ellipse, and
   a second elliptical mirror arranged on a detector side of the hyperbolic mirror and formed along a second ellipse with one focal point substantially the same as the other focal point of the hyperbolic curve and the other focal point substantially the same as the other focal point of the first ellipse, the second ellipse orthogonal to the first ellipse.

5. The imaging device according to claim 1,
wherein the first image forming element comprises a first elliptical mirror a reflecting surface shape of which is formed along a first ellipse, and
the second image forming element comprises:
- a second elliptical mirror a reflecting surface shape of which is formed along a second ellipse with one focal point substantially the same as one focal point of the first ellipse, the second ellipse orthogonal to the first ellipse, and
- a hyperbolic mirror arranged on a detector side of the second elliptical mirror and formed along a hyperbolic curve with one focal point substantially the same as the other focal point of the first ellipse and the other focal point substantially the same as the other focal point of the second ellipse.

6. The imaging device according to claim 1,
wherein the linear sensor includes a superconducting single photon detector.

7. The imaging device according to claim 1,
wherein the linear sensor includes one or a plurality of pixels.

8. The imaging device according to claim 1,
wherein the detector includes a plurality of linear sensors arranged in parallel while sharing a light receiving surface.

9. The imaging device according to claim 1, comprising:
a stage that holds the sample and rotates the sample with an optical axis of the imaging light as a rotation axis.

10. The imaging device according to claim 1, comprising:
a stage that holds the sample and capable of moving the sample along a plane perpendicular to an optical axis of the imaging light; and
a rectangular aperture the center of gravity of which coincides with the optical axis.

11. The imaging device according to claim 1,
wherein the imaging light includes X rays.

12. An image generating device comprising:
a light source that irradiates a sample with imaging light;
the imaging device according to claim 1; and
an image reconfiguration unit that performs image reconfiguration of the sample on the basis of an output of the detector.

13. An imaging method comprising:
irradiating a sample with imaging light;
collecting components of the imaging light in a first direction and forming an image on a light receiving surface of a detector including a linear sensor including a linear light receiving surface extending in the first direction through a first image forming element with a first wave front aberration amount; and
collecting components of the imaging light in a second direction orthogonal to the first direction and forming an image on the light receiving surface through a second image forming element with a second wave front aberration amount smaller than the first wave front aberration amount.

14. The imaging method according to claim 13,
wherein the aperture limits the imaging light applied to the sample into a circular shape.

15. The imaging method according to claim 13,
wherein a length of the linear sensor in the first direction is longer than a length obtained by adding an image spread amount generated by the first wave front aberration amount to a value corresponding to a width in the first direction of an irradiation region of the imaging light applied to the sample.

* * * * *